US010991546B1

(12) United States Patent
Kowal

(10) Patent No.: US 10,991,546 B1
(45) Date of Patent: Apr. 27, 2021

(54) ISOLATED LINAC RESONATOR PICKUP CIRCUIT

(71) Applicant: Applied Materials, Inc., Santa Clara, CA (US)

(72) Inventor: Keith E. Kowal, Swampscott, MA (US)

(73) Assignee: Applied Materials, Inc., Santa Clara, CA (US)

( * ) Notice: Subject to any disclaimer, the term of this patent is extended or adjusted under 35 U.S.C. 154(b) by 23 days.

(21) Appl. No.: 16/663,553

(22) Filed: Oct. 25, 2019

(51) Int. Cl.
*H01J 37/304* (2006.01)
*H01J 37/317* (2006.01)

(52) U.S. Cl.
CPC ........ *H01J 37/304* (2013.01); *H01J 37/3171* (2013.01)

(58) Field of Classification Search
CPC ............................ H01J 37/304; H01J 37/3171
USPC ............................................ 250/492.1–492.3
See application file for complete search history.

(56) References Cited

U.S. PATENT DOCUMENTS

| | | | | |
|---|---|---|---|---|
| 4,982,320 A | * | 1/1991 | Eaton | G05B 13/0205 315/500 |
| 2001/0013785 A1 | * | 8/2001 | Yao | H05H 7/18 324/633 |
| 2008/0087808 A1 | | 4/2008 | Ledoux et al. | |
| 2010/0200775 A1 | | 8/2010 | Lin et al. | |
| 2018/0068828 A1 | | 3/2018 | Halling | |
| 2018/0197716 A1 | | 7/2018 | Sasaki | |

FOREIGN PATENT DOCUMENTS

| | | |
|---|---|---|
| JP | 208-112674 A | 5/2008 |
| KR | 10-2019-0044620 A | 4/2019 |

OTHER PUBLICATIONS

International Search Report and Written Opinion dated Jan. 26, 2021 in corresponding PCT application No. PCT/US2020/051761.

* cited by examiner

*Primary Examiner* — Michael Maskell
(74) *Attorney, Agent, or Firm* — Nields, Lemack & Frame, LLC

(57) ABSTRACT

A monitoring circuit that includes a pickup loop to monitor a voltage applied to a cavity of a linear accelerator is disclosed. The monitoring circuit is electrically isolated from the linear accelerator and is also electrically isolated from the controller that receives input from the circuit and controls the linear accelerator. In certain embodiments, the monitoring circuit also includes an energy harvester so as to capture energy without any physical connection to the controller. This may be achieved using light energy or electromagnetic energy, for example. In certain embodiments, the monitoring circuit includes an analog-to-digital converter to convert the signals received from the pickup loop to digital values. In other embodiments, the monitoring circuit passes analog voltages to the controller. The outputs from the monitoring circuit may include the amplitude and phase of the voltage being applied to the respective cavity.

20 Claims, 4 Drawing Sheets

ISOLATED LINAC RESONATOR PICKUP CIRCUIT

FIELD

Embodiments of the present disclosure relate to systems for detecting a voltage and/or current of a LINAC resonator element and transmitting that voltage or current to a controller.

BACKGROUND

The fabrication of a semiconductor device involves a plurality of discrete and complex processes. In some of these processes, ions are accelerated toward a workpiece. These ions may be accelerated in a number of ways. For example, electrical fields are commonly used to attract and accelerate positively charged ions.

In certain embodiments, a linear accelerator (or LINAC) may be used to accelerate these ions. In certain embodiments, a LINAC includes a plurality of RF cavities which each serve to further accelerate the ions passing therethrough. The LINAC may operate optimally when each of the RF cavities is energized at its respective resonant frequency.

While LINACs are useful in accelerating ions, there are challenges associated with their use. For example, in certain embodiments, the cavities may be energized at voltages that are in the megavolts. Further, it is also possible that glitches or other anomalies occur in the LINAC, which may affect the quality of the beam.

Consequently, monitoring the voltages being applied to each cavity of the LINAC may be difficult, as there is the potential of ground loops and glitches.

Therefore, it would be advantageous if there were a system that is capable of reliably measuring the voltages associated with the LINAC. It would be beneficial if the system were electrically isolated from the LINAC and from the controller.

SUMMARY

A monitoring circuit that includes a pickup loop to monitor a voltage applied to a cavity of a linear accelerator is disclosed. The monitoring circuit is electrically isolated from the resonator cavity and is also electrically isolated from the controller that receives input from the circuit and controls the linear accelerator. In certain embodiments, the monitoring circuit also includes an energy harvester so as to capture energy without any physical connection to the controller. This may be achieved using light energy or electromagnetic energy, for example. In certain embodiments, the monitoring circuit includes an analog-to-digital converter to convert the signals received from the pickup loop to digital values. In other embodiments, the monitoring circuit passes analog voltages to the controller. The outputs from the monitoring circuit may include the amplitude and phase of the voltage being applied to the respective cavity.

According to one embodiment, an ion implantation system is disclosed. The ion implantation system comprises an ion source to generate ions; a linear accelerator to accelerate the ions toward a workpiece, wherein the linear accelerator comprises one or more cavities; a controller; and a monitoring circuit, comprising: a pickup loop disposed proximate one of the cavities; a transceiver to transmit and receive information from the controller; wherein the monitoring circuit is electrically isolated from the controller and the linear accelerator. In certain embodiments, the ion implantation system further comprises a RF generator in communication with the controller; and an excitation coil and a resonator coil disposed in each cavity, wherein the RF generator supplies an excitation voltage to the excitation coil. In some embodiments, the pickup loop received an induced signal from the cavity, and information about this induced signal is transmitted from the monitoring circuit to the controller without physical electrical connections. In certain embodiments, the controller uses the information from the monitoring circuit to control the RF generator. In certain embodiments, the information comprises an amplitude and phase of the induced signal. In some embodiments, the ion implantation system further comprises a tuner paddle disposed in each cavity, wherein the controller controls a position of the tuner paddle in the cavity based on information from the monitoring circuit. In certain embodiments, the monitoring circuit detects glitches on the pickup loop. In some embodiments, the monitoring circuit comprises an energy harvest circuit to provide power to the monitoring circuit without physical electrical connections. In certain embodiments, the controller comprises an energy source, wherein energy from the energy source is transmitted to the energy harvest circuit wirelessly. In certain embodiments, the transceiver comprises a fiber optic transceiver. In some embodiments, the monitoring circuit and the controller are disposed on one printed circuit board with separate ground and power planes.

According to another embodiment, a monitoring circuit for use with an ion implantation system is disclosed. The monitoring circuit comprises an energy harvest circuit to provide power; a pickup loop on which a voltage or current is induced; an amplifier to amplify a signal from the pickup loop; an analog to digital converter (ADC) to convert the signal to a digital representation; and a transceiver to transmit the digital representation to a controller; wherein the monitoring circuit is electrically isolated from the controller. In certain embodiments, the energy harvest circuit comprises a transducer, a conversion circuit and an energy storage circuit. In some embodiments, the transducer comprises a photosensor. In some embodiments, the transceiver comprises a fiber optic transceiver.

According to another embodiment, a monitoring circuit for use with an ion implantation system is disclosed. The monitoring circuit comprises an energy harvest circuit to provide power; a pickup loop on which a voltage or current is induced; an amplifier to amplify a signal from the pickup loop; an amplitude detection circuit; a phase detection circuit; an analog multiplexer having an output of the amplitude detection circuit and an output of the phase detection circuit as inputs; and a transceiver to transmit an output from the analog multiplexer to a controller; wherein the monitoring circuit is electrically isolated from the controller. In certain embodiments, the controller transmits a master clock signal to the monitoring circuit using the transceiver and the master clock signal is used by the phase detection circuit. In certain embodiments, the controller transmits a control signal to the monitoring circuit using the transceiver and the control signal is used by the analog multiplexer to select one of the inputs. In some embodiments, the transceiver comprises a fiber optic transceiver. In certain embodiments, the energy harvest circuit comprises a transducer, a conversion circuit and an energy storage circuit.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
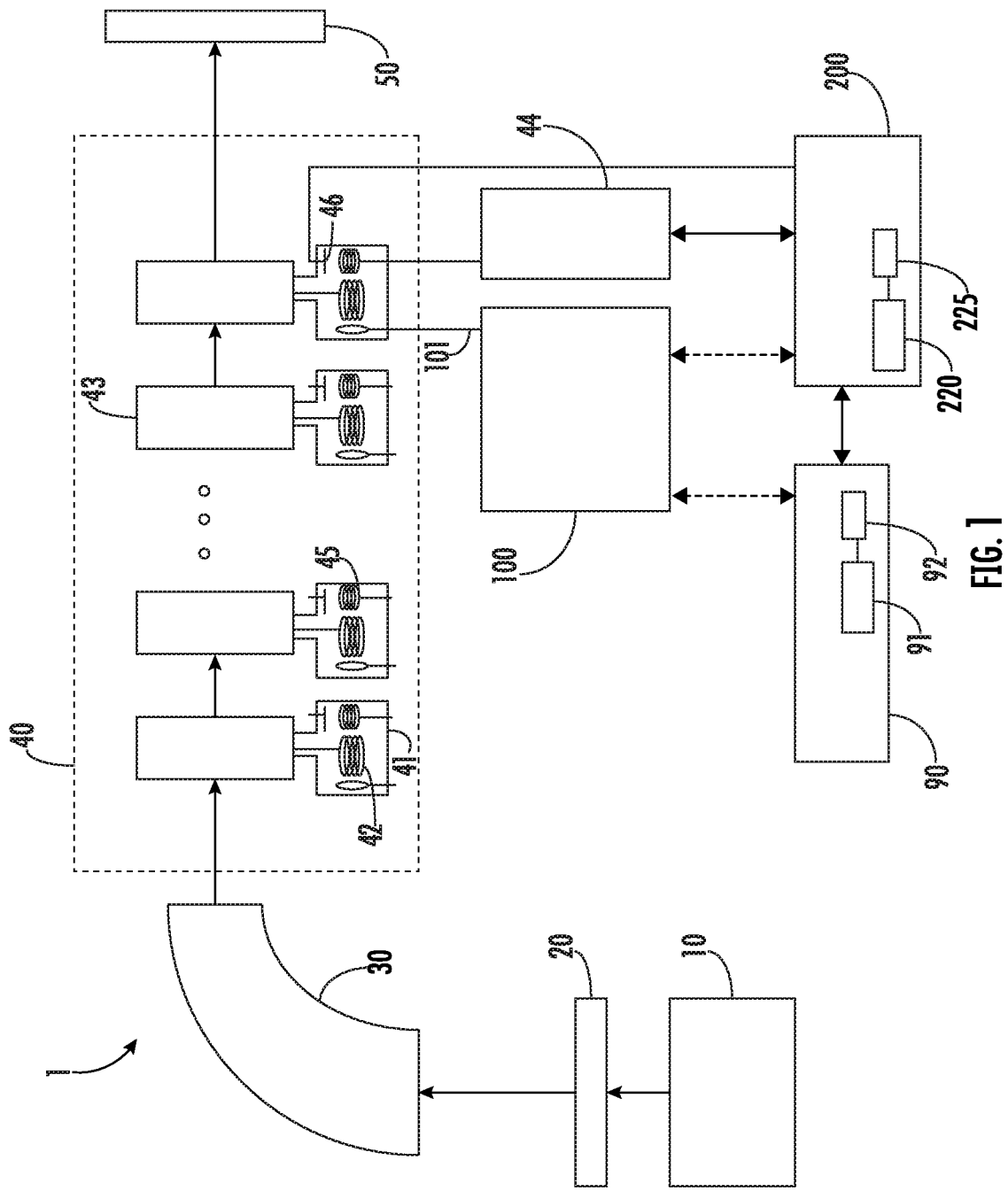
FIG. 1 shows a block diagram of the ion implantation system utilizing a linear accelerator, or LINAC, according to one embodiment.

As described above, linear accelerators may be used to accelerate ions toward a workpiece. FIG. 1 shows an ion implantation system 1. The ion implantation system 1 comprises an ion source 10. The ion source 10 may be any suitable ion source, such as, but not limited to, an indirectly heated cathode (IHC) source, a Bernas source, a capacitively coupled plasma source, an inductively coupled plasma source, or any other suitable device. The ion source 10 has an aperture through which ions may be extracted from the ion source 10. These ions may be extracted from the ion source 10 by applying a negative voltage to one or more electrodes 20, disposed outside the ion source 10, proximate the extraction aperture. The electrodes 20 may be pulsed so that ions exit at specific times. The group of ions that exits may be referred to as a bunch.

The ions may then enter a mass analyzer 30, which may be a magnet that allows ions having a particular mass to charge ratio to pass through. This mass analyzer 30 is used to separate only the desired ions. It is the desired ions that then enter the linear accelerator 40.

The linear accelerator 40 comprises one or more cavities 41. In certain embodiments, there may be between one and sixteen cavities 41 in the linear accelerator 40. Each cavity 41 comprises a resonator coil 42 that may be energized by electromagnetic fields created by an excitation coil 45. The excitation coil 45 is disposed in the cavity 41 with a respective resonator coil 42. The excitation coil 45 is energized by an excitation voltage, which may be a RF signal. The excitation voltage may be supplied by a respective RF generator 44. In other words, the excitation voltage applied to each excitation coil 45 may be independent of the excitation voltage supplied to any other excitation coil 45. Each excitation voltage is preferably modulated at the resonance frequency of its respective cavity 41. The magnitude and phase of the excitation voltage may be determined and changed by the controller 200, which is in communication with the RF generator 44. By disposing the resonator coil 42 in a cavity 41, the magnitude of the excitation voltage may be increased or phase shifted while keeping the amplitude the same.

Within each cavity 41, there may be a respective tuner paddle 46. The tuner paddle 46 may be in communication with an actuator so as to modify its position within the cavity 41. The position of the tuner paddle 46 may affect the resonant frequency of the cavity 41. The actuator may be controlled by the controller 200.

When an excitation voltage is applied to the excitation coil 45, a voltage is induced on the resonator coil 42. The result is that the resonator coil 42 in each cavity 41 is driven by a sinusoidal voltage. Each resonator coil 42 may be in electrical communication with a respective accelerator electrode 43. The ions pass through apertures in each accelerator electrode 43.

The entry of the bunch into a particular accelerator electrode 43 is timed such that the potential of the accelerator electrode 43 is negative as the bunch approaches, but switches to positive as the bunch passes through the accelerator electrode 43. In this way, the bunch is accelerated as it enters the accelerator electrode 43 and is repelled as it exits. This results in an acceleration of the bunch. This process is repeated for each accelerator electrode 43 in the linear accelerator 40. Each accelerator electrode increases the acceleration of the ions and can be measured.

After the bunch exits the linear accelerator 40, it is implanted into the workpiece 50.

Of course, the ion implantation system 1 may include other components, such as an electrostatic scanner to create a ribbon beam, quadrupole elements, additional electrodes to accelerate or decelerate the beam and other elements.

In certain embodiments, the ion implantation system 1 also includes a monitoring circuit 100 and a controller 200. In certain embodiments, there is a separate monitoring circuit 100 for each cavity 41. FIG. 1 shows only a single monitoring circuit 100 and controller 200. However, these components may be replicated for each cavity 41. For example, each cavity 41 may be associated with a respective RF generator 44, monitoring circuit 100 and controller 200.

The monitoring circuit 100 includes a pickup loop 101 that is disposed proximate or within one of the cavities 41. A sinusoidal voltage is induced on the pickup loop 101 by the electromagnetic fields near or within the cavity 41. The monitoring circuit 100 receives this sinusoidal voltage from the pickup loop 101 and provides some signal processing. The monitoring circuit 100 transmits these processed signals to the controller 200 without any electrical connections, as described below. The pickup loop 101 may be simply a looped wire.

The controller 200 comprises a processing unit 220 and an associated memory device 225. This memory device 225 contains the instructions, which, when executed by the processing unit 220, enable the controller 200 to perform the functions described herein. The processing unit 220 may be a microprocessor, a signal processor, a customized field programmable gate array (FPGA), or another suitable unit. This memory device 225 may be a non-volatile memory, such as a FLASH ROM, an electrically erasable ROM or other suitable devices. In other embodiments, the memory device 225 may be a volatile memory, such as a RAM or DRAM.

A global controller 90 is also shown. The global controller may be in communication with a plurality of monitoring circuits 100 and controllers 200. The global controller 90 may create a master clock that is used by the rest of the ion implantation system 1. The global controller 90 may include a processing unit 91 and a memory device 92. The processing unit 91 may be a microprocessor, a signal processor, a customized field programmable gate array (FPGA), or another suitable unit. This memory device 92 may be a non-volatile memory, such as a FLASH ROM, an electrically erasable ROM or other suitable devices. In other embodiments, the memory device 92 may be a volatile memory, such as a RAM or DRAM. The memory device 92 comprises instructions that enable the global controller 90 to perform the tasks described herein.

Figure 2:
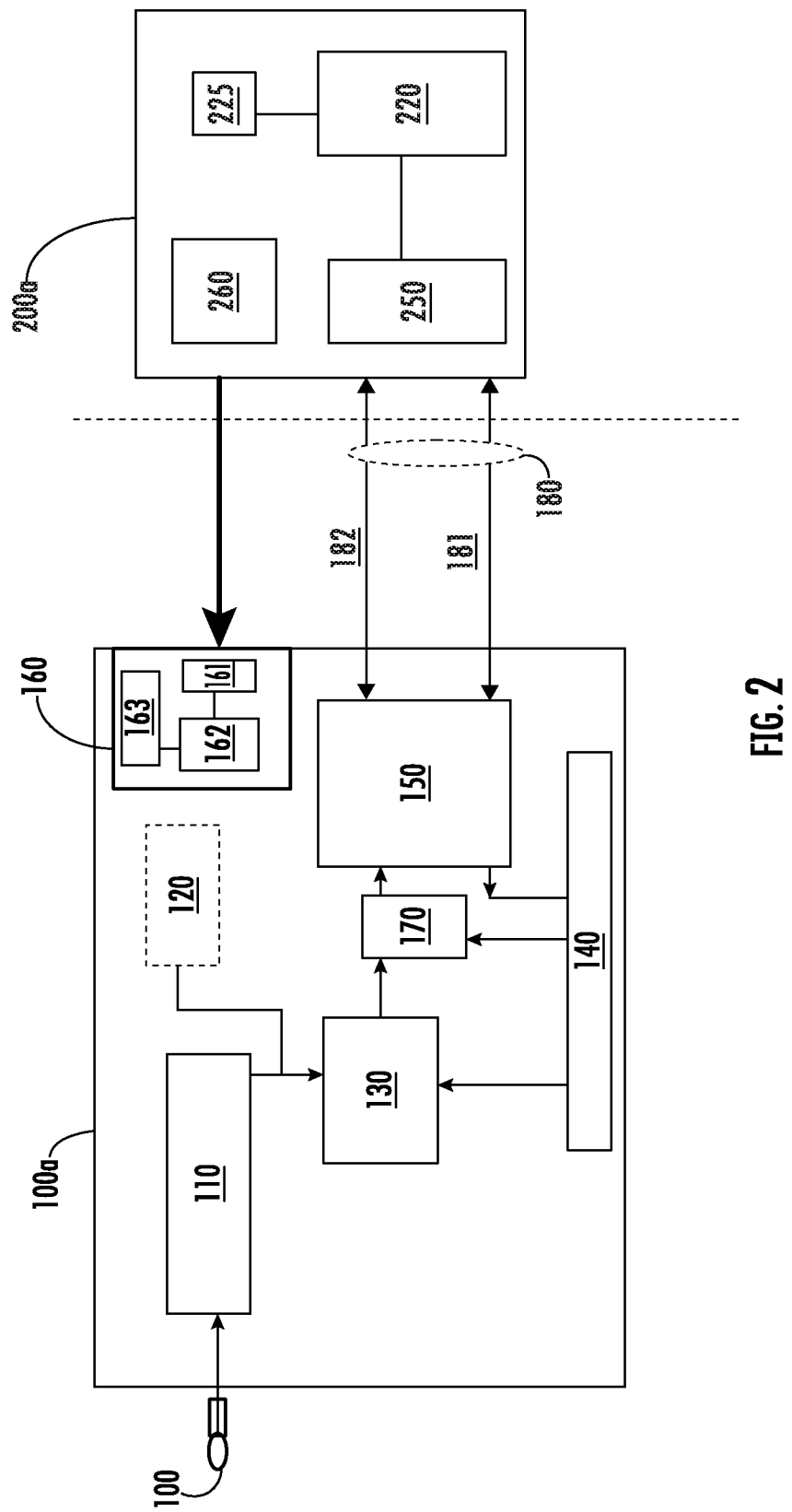
FIG. 2 shows the monitoring circuit according to one embodiment.

FIG. 2 shows a first embodiment of the monitoring circuit 100a and the controller 200a.

The monitoring circuit 100a includes a pre-amplifier 110. The pre-amplifier 110 is used to amplify the sinusoidal signal induced on the pickup loop 101. For example, the output of the pre-amplifier 110 may be a voltage between 0-10 or between +/−5 volts. In other embodiments, the output of the pre-amplifier 110 may have a different range of voltages. In other embodiments, the output of the pickup loop 101 may be a current.

In certain embodiments, the output of the pre-amplifier 110 serves as an input to a glitch detection circuit 120. The glitch detection circuit 120 is used to determine when a glitch has occurred on the signal induced on the pickup loop 101. In certain embodiments, this information may be transmitted directly to the global controller 90 via a fiber optic connection (not shown) to maintain electrical isolation. If an event occurs, the global controller 90 can make a decision regarding appropriate actions. In other embodiments, the information from the glitch detection circuit 120 may be transmitted to the controller 200*a*. In certain embodiments, the controller 200*a* can adjust the resonance frequency, if desired. This may be done by actuating the tuner paddle 46.

The output of the pre-amplifier 110 may also serve as an input to an analog-to-digital converter (ADC) 130. The ADC 130 samples the analog voltage received from the pre-amplifier 110 and generates a digital representation of that analog voltage. The digital representation may be an 8, 12 or 16 bit representation in certain embodiments. The ADC 130 may sample the analog voltage periodically or at regular intervals.

In order to periodically sample the analog voltage, the monitoring circuit 100*a* also comprises a clock generation and control circuit 140. The clock generation and control circuit 140 is responsible for creating the clock signals used in the monitoring circuit 100*a*. In one embodiment, the clock generation and control circuit 140 may be in communication with a crystal, which oscillates at a fixed frequency. This fixed frequency may be used to generate the clock signal used by the ADC 130. In another embodiment, the controller 200*a* may supply control signals 181 to the monitoring circuit 100*a*. One of these control signals may be a master clock signal. The clock generation and control circuit 140 may receive this master clock signal as an input and use this master clock signal to generate the clock signal used by the ADC 130. The particular implementation used to generate the clock signal to the ADC 130 is not limited by this disclosure.

The output from the ADC 130 may enter a data conditioning circuit 170. The data conditioning circuit 170 may be used to condition the digital representation prior to transmission to the controller 200*a*. This may be a log amp which can be used to automatically adjust gain, or simply a pre-amp. In other embodiments, the output from the ADC 130 may directly enter the transceiver 150.

The output of the data conditioning circuit 170 enters the transceiver 150, where the data 182 is transmitted to the controller 200*a*. The transceiver 150 communicates with the controller 200*a* without the use of any physical electrical connections.

In one embodiment, the transceiver 150 is a fiber optic transceiver. In this embodiment, the transceiver 150 may condition and encode the data 182 into light pulses. These light pulses travel through a fiber 180 to the controller 200*a*.

The controller 200*a* includes a corresponding transceiver 250 that interfaces with the transceiver 150. In the case of fiber optics, glass fibers 180 are used to connect the two transceivers.

In addition to receiving data 182 from the monitoring circuit 100*a*, the controller 200*a* is also able to send control signals 181 to the monitoring circuit 100*a*. As described above, the control signals 181 may be used by the clock generation and control circuit 140 to generate the signals needed for the sampling of the incoming signals.

Thus, the monitoring circuit 100*a* and the controller 200*a* are able to transmit data 182 and control signals 181 between each other without any physical electrical connections. In this way, there are no common grounds and no potential ground loops.

To further isolate the monitoring circuit 100*a* from the controller 200*a*, the monitoring circuit 100*a* also includes an energy harvest circuit 160. The energy harvest circuit 160 is used to supply the power to the monitoring circuit 100*a*. The energy harvest circuit 160 includes a transducer 161, a conversion circuit 162 and an energy storage circuit 163. The transducer 161 receives an input and converts this input into electrical energy. In one embodiment, the transducer 161 may be a photosensor, which receives light and converts the light into electrical energy. In another embodiment, the transducer 161 may be a thermoelectric transducer, which converts heat to electrical energy. In another embodiment, the transducer 161 may be a piezoelectric device, which converts vibration or movement to electrical energy. In another embodiment, the transducer 161 may be a RF transducer, which converts RF energy into electrical energy. In yet another embodiment, the transducer 161 may be an inductive transducer, which converts magnetic fields to electrical energy. Note that in each of these embodiments, the input energy is received by the energy harvest circuit 160 without any physical electrical connections.

The electrical energy produced by the transducer 161 is conditioned by the conversion circuit 162. The conversion circuit 162 is used to collect the energy output by the transducer 161 and convert this to a desired voltage, such as 3.3V, 5V or some other voltage. The output from the conversion circuit 162 is then stored in the energy storage circuit 163. In certain embodiments, the energy storage circuit 163 comprises one or more capacitors and support circuits.

The output of the energy storage circuit 163 may be used to supply power to the rest of the monitoring circuit 100*a*.

In certain embodiments, the controller 200*a* cooperates with the monitoring circuit 100*a* to provide the energy to the energy harvest circuit 160. For example, the controller 200*a* may include an energy source 260. In one embodiment, this energy source 260 comprises a light source, such as a LED or laser. This light source may be directed toward a photosensor disposed on the monitoring circuit 100*a* to maximize the efficiency of the energy harvesting. In another embodiment, the energy source 260 may be a coil driven by an alternating current to create an electrical field which can be received by an inductive transducer. In another embodiment, the energy source 260 may be an RF generator, which emits RF energy that is captured by an RF transducer. Of course, other energy sources may also be utilized.

In certain embodiments, the controller 200*a* and the monitoring circuit 100*a* may be disposed on physically distinct printed circuit boards. In another embodiment, the controller 200*a* and the monitoring circuit 100*a* may be disposed on a single printed circuit board, where the power and ground planes are physically separated. For example, the ground layer may comprise two separate ground planes, which are separated physically from one another.

In operation, the controller 200*a* may actuate the energy source 260. This provides energy for the energy harvest circuit 160. Soon thereafter, a sufficient amount of power may be stored in the energy storage circuit 163 such that the remaining components on the monitoring circuit 100*a* may receive power. Thus, at this time, the monitoring circuit 100*a* is completely operational. Note, again, that there are no physical electrical connections between the controller 200*a* and the monitoring circuit 100a. Once powered, the monitoring circuit 100a may receive sinusoidal signals from the pickup loop 101. In certain embodiments, the controller 200a provides control signals 181 to the monitoring circuit 100a using the transceiver 250. These control signals 181 from the controller 200a are used to determine the sample rate of the ADC 130. The digital representations output from the ADC 130 are then transmitted to the controller 200a using the transceiver 150. These values are received by the transceiver 250 and transferred to the processing unit 220. The information received by processing unit 220 may be used to maintain resonance and controlling the RF generator 44 accordingly. The processing unit 220 may use this information in a number of different ways, as described below.

Figure 3:
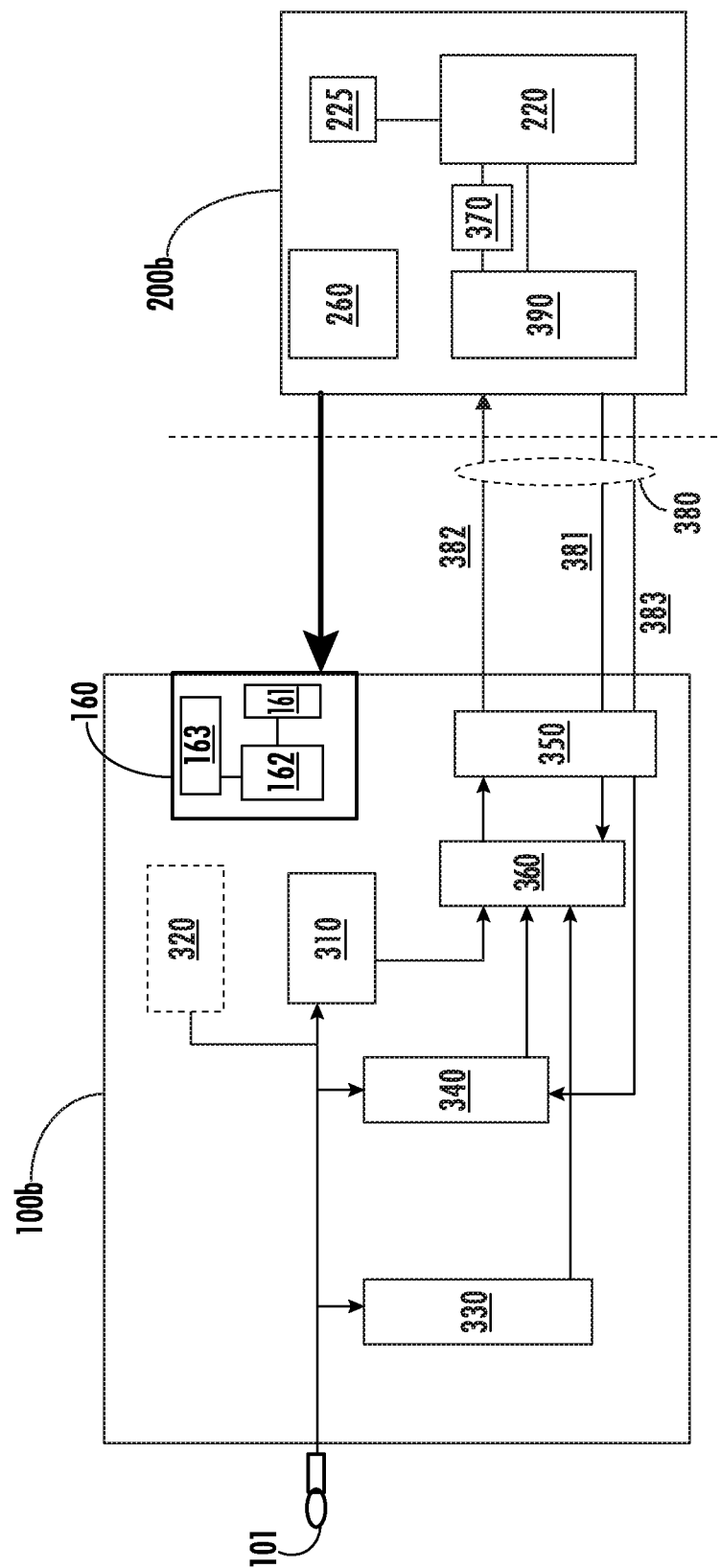
FIG. 3 shows the monitoring circuit according to a second embodiment.

FIG. 3 shows another embodiment of the monitoring circuit 100b and the controller 200b. In this embodiment, the monitoring circuit 100b does not include an analog-to-digital converter. Rather, the monitoring circuit 100b transmits analog signals to the controller 200b.

Thus, as was described with respect to FIG. 2, the sinusoidal voltage induced on the pickup loop 101 is an input to the pre-amplifier 310. The output of the pre-amplifier 310 may be one of several inputs to an analog multiplexer 360.

In certain embodiments, the sinusoidal voltage induced on the pickup loop 101 may also be an input to a glitch detection circuit 320. The glitch detection circuit 320 is as was described with respect to FIG. 2.

The sinusoidal voltage induced on the pickup loop 101 may also used to perform other functions. For example, in one embodiment, an amplitude detection circuit 330 is used to determine the amplitude of the sinusoidal signal induced on the pickup loop 101. The output of the amplitude detection circuit 330 may be an analog voltage, representative of the amplitude of the sinusoidal signal. The amplitude detection circuit 330 may be an envelope detector or another type of circuit. The output of the amplitude detection circuit 330 may be another input to the analog multiplexer 360.

Additionally, the sinusoidal voltage induced on the pickup loop 101 may serve as an input to a phase detection circuit 340. The phase detection circuit 340 compares the phase of the incoming sinusoidal signal with a fixed reference and outputs a voltage that is representative of the phase difference between these two signals. In certain embodiments, this fixed reference may be a master clock signal 383 received from the controller 200b. The output of the phase detection circuit 340 may be another input to the analog multiplexer 360.

The analog multiplexer 360 may have a plurality of inputs. In FIG. 3, three inputs are shown, although the number of inputs is not limited by this disclosure. Further, all of the circuits described above (i.e. the amplitude detection circuit 330 and the phase detection circuit 340) may not be included in the monitoring circuit 100b.

One or more control signals 381 from the controller 200b may be used to select one of the plurality of inputs to be passed through to the output of the analog multiplexer 360. This output from the analog multiplexer 360 then is transmitted via the transceiver 350 to the controller 200b.

The output from the analog multiplexer 360 is transmitted as data 382 by the transceiver 350 and is received by the transceiver 390. As described above, the transceiver may be a fiber optic transceiver that utilizes fibers 380. The received data 382 is sampled by an analog-to-digital converter (ADC) 370 disposed on the controller 200b. The output of the ADC 370 may then be provided to the processing unit 220.

The energy harvest circuit 160 of the monitoring circuit 100b of FIG. 3 is as described with respect to the energy harvest circuit 160 of FIG. 2. Similarly, the energy source 260 on the controller 200b is as described with respect to FIG. 2.

As noted above, in both embodiments, the monitoring circuit 100 is configured to supply data to the controller 200 regarding the voltage that is being applied to the cavity 41 of the linear accelerator 40. This information can be used by the controller 200 in several ways.

First, the processing unit 220 may vary the frequency of the excitation voltage applied to the cavity 41 seeking to induce a resonant condition. In other words, when the frequency of the excitation voltage applied to the excitation coil 45 matches the natural resonant frequency of the resonator coil 42 and cavity 41, the amplitude of the voltage induced by the pickup loop 101 will be at its maximum value. Thus, the processing unit 220 may select a particular frequency for the excitation voltage, instruct the RF generator 44 to apply that excitation voltage to the excitation coil 45 and obtain feedback from the monitoring circuit 100 that indicates the relative amplitude of the induced voltage.

In the monitoring circuit 100a of FIG. 1, the controller 200a may obtain multiple samples from the ADC 130 to determine the peak amplitude. In the monitoring circuit 100b of FIG. 3, the controller 200b may control the analog multiplexer 360 to select the output of the amplitude detection circuit 330. The analog voltage received from the amplitude detection circuit 330 is representative of the amplitude of the induced signal. The processing unit 220 then samples the analog-to-digital converter (ADC) 370 once to determine the amplitude of the induced voltage.

The controller 200 may then modify the frequency of the excitation voltage by instructing the RF generator 44 to modify the output frequency of the excitation voltage. The controller 200 may then obtain an indication of the amplitude of the induced signal, as described above. The controller 200 may repeat this until the maximum induced voltage has been achieved.

By varying the frequency of the excitation voltage applied to the excitation coil 45, the processing unit 220 may be able to optimize the performance of the linear accelerator 40 by ensuring that each cavity 41 is operating at its resonant frequency.

In certain embodiments, it may be desirable for all of the cavities 41 to have the same resonant frequency. Thus, in this embodiment, the controller 200 may repeat the sequence described above, but instead of changing the frequency applied by the RF generator 44, the controller 200 varies the position of the tuner paddle 46 in the cavity 41 until the predetermined resonant frequency is attained.

Additionally, the controller 200 may also control the phase of the voltage being generated by the resonator coil 42. As noted above, the entry of the bunch into a particular accelerator electrode 43 is timed such that the potential of the accelerator electrode 43 is negative as the bunch approaches, but switches to positive as the bunch passes through the accelerator electrode 43. In this way, the bunch is accelerated as it enters the accelerator electrode 43 and is repelled as it exits. In order to maximize this effect, the phases of each accelerator electrode 43 are properly correlated.

In the monitoring circuit 100a of FIG. 1, the controller 200a may obtain multiple samples from the ADC 130 to determine the phase of the induced voltage. For example, the signal that is reconstructed from the multiple samples from the ADC 130 may be compared to a master clock signal to determine phase. In the monitoring circuit 100*b* of FIG. 3, the controller 200*b* may control the analog multiplexer 360 to select the output of the phase detection circuit 340. The analog voltage received from the phase detection circuit 340 is representative of the phase of the induced signal. The processing unit 220 then samples the analog-to-digital converter (ADC) 370 once to determine the phase of the induced voltage.

Each controller 200 may be instructed by a global controller 90 of the desired phase. The controller 200 then attempts to achieve this phase. For example, the controller 200 may utilize a phase lock loop, which increases the frequency temporarily if the phase is lagging and decreases the frequency temporarily if the phase is leading. In another embodiment, the controller 200 may modify the position of the tuner paddle 46 in the cavity 41 to adjust the phase of the induced voltage.

Thus, with the monitoring circuit 100*a* of FIG. 2, the processing unit 220 monitors the digital representation of the induced voltage and determine its amplitude and phase. This may be done by sampling the induced voltage at a sampling frequency that is at least twice the frequency of the excitation voltage. Based on its determination of the amplitude and phase, the processing unit 220 is able to optimize the frequency and phase of the excitation voltage.

With respect to FIG. 3, the monitoring circuit 100*b* comprises circuits that provide analog voltages that are representative of the voltage and phase of the induced signal. The processing unit 220 may then sample these analog voltages using ADC 370. Based on its determination of the amplitude and phase, the processing unit 220 is able to optimize the frequency and phase of the excitation voltage which keeps the resonator coil in resonance.

The above disclosure describes normal operation. However, other factors may also be considered. For example, in the event of a glitch, the glitch detection circuit 120 provides information to the global controller 90. The global controller 90 may instruct the controller 200 to recalibrate the cavity 41 or take some other action.

Additionally, temperature variation and vibration may affect the natural resonant frequency of the cavity 41. The controller 200 may continuously monitor the amplitude of the induced signal. A decrease in its maximum amplitude may be indicative of a drift in the natural resonant frequency. The controller 200 may initiate a corrective action. For example, in one embodiment, the controller 200 may move the tuner paddle 46 in the cavity 41 to reacquire the resonant frequency. The controller 200 may report any change in the resonant frequency to the global controller 90. The global controller 90 may then instruct the controller 200 to take some corrective action.

While the above disclosure describes the use of the monitoring circuit with a linear accelerator 40, the disclosure is not limited to this embodiment. The present monitoring circuit may be employed in any environment that needs electrical isolation from both the system being monitored and the controller. For example, the monitoring circuit described herein may be used to measure current in an ion implantation system.

Figure 4:
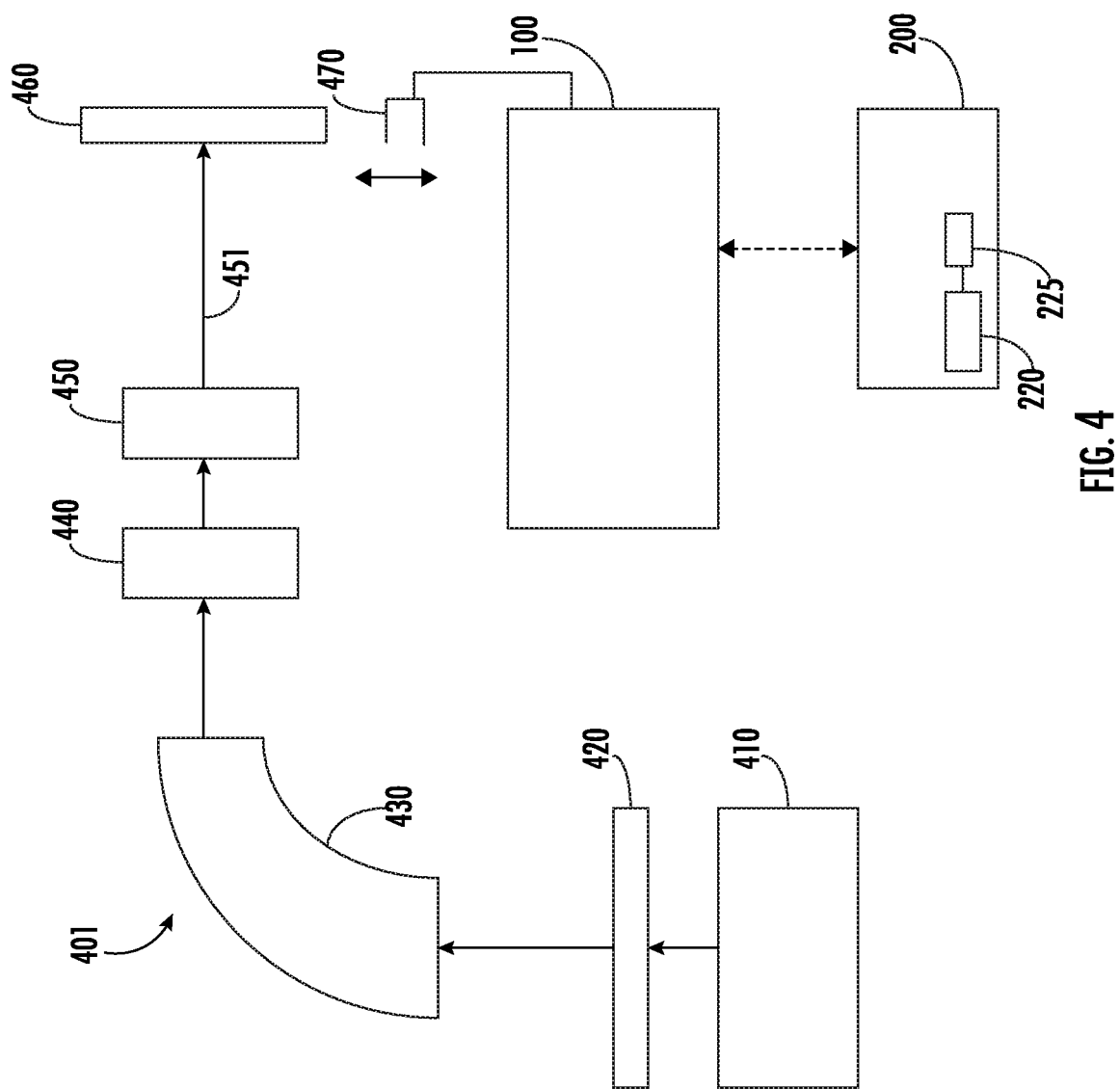
FIG. 4 shows a block diagram of an ion implantation system according to another embodiment.

For example, FIG. 4 shows an ion implantation system 401 that includes a current measuring device, such as a Faraday device. The ion implantation system 401 comprises an ion source 410. The ion source 410 may be any suitable ion source, such as, but not limited to, an indirectly heated cathode (IHC) source, a Bernas source, a capacitively coupled plasma source, an inductively coupled plasma source, or any other suitable device. The ion source 410 has an aperture through which ions may be extracted from the ion source 410. These ions may be extracted from the ion source 410 by applying a negative voltage to one or more electrodes 420, disposed outside the ion source 410, proximate the extraction aperture.

The ions may then enter a mass analyzer 430, which may be a magnet that allows ions having a particular mass to charge ratio to pass through. This mass analyzer 430 is used to separate only the desired ions. It is the desired ions that then enter one or more acceleration/deceleration stages 440. The ions that exit the acceleration/deceleration stages 440 may then be transformed into a ribbon ion beam 451 through the use of an electrostatic scanner 450. The ribbon ion beam 451 is then directed toward the workpiece 460. To measure the actual beam current, current measuring devices 470, such as Faraday cups may be disposed near the workpiece 460. The current measuring devices 470 may be in communication with an actuator so as to move in and out of the path of the beam. To measure current, the workpiece 460 is moved away so that the ribbon ion beam 451 strikes the Faraday cups.

The output of the Faraday cup replaces the pickup loop 101 in the monitoring circuit 100. The remainder of the monitoring circuit is exactly 100 as described above. However, in this case, rather than measuring voltage, the monitoring circuit 100 monitors current. However, like the other embodiments, the monitoring circuit 100 is electrically isolated from both the ion implantation system 401 and the controller 200.

The present system has many advantages. The ability to monitor parameters in high voltage systems is very advantageous. However, often, it is problematic monitoring a high voltage system using conventional measuring devices. Specifically, the high voltage system may have a different ground reference than the controller. Further, these high voltage systems may arc or glitch, which may affect the ground plane of that system. If a typical controller is connected to the same ground plane, the controller may be damaged by these arcs or glitches. The present system overcomes these shortcomings by introducing a monitoring circuit that is electrically isolated from both the system being monitored, and the controller. Additionally, because the monitoring circuit is electrically isolated, the accuracy of the voltages being monitored is improved.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion implantation system, comprising:
   an ion source to generate ions;
   a linear accelerator to accelerate the ions toward a workpiece, wherein the linear accelerator comprises one or more cavities;

a controller; and a monitoring circuit, comprising:
    a pickup loop disposed proximate one of the cavities;
    a transceiver to transmit and receive information from the controller; wherein the monitoring circuit is electrically isolated from the controller and the linear accelerator.

2. The ion implantation system of claim 1, further comprising:
    a RF generator in communication with the controller; and
    an excitation coil and a resonator coil disposed in each cavity,
        wherein the RF generator supplies an excitation voltage to the excitation coil.

3. The ion implantation system of claim 2, wherein the pickup loop received an induced signal from the cavity, and information about this induced signal is transmitted from the monitoring circuit to the controller without physical electrical connections.

4. The ion implantation system of claim 3, wherein the controller uses the information from the monitoring circuit to control the RF generator.

5. The ion implantation system of claim 4, wherein the information comprises an amplitude and phase of the induced signal.

6. The ion implantation system of claim 3, further comprising a tuner paddle disposed in each cavity, wherein the controller controls a position of the tuner paddle in the cavity based on information from the monitoring circuit.

7. The ion implantation system of claim 1, wherein the monitoring circuit detects glitches on the pickup loop.

8. The ion implantation system of claim 1, wherein the monitoring circuit comprises an energy harvest circuit to provide power to the monitoring circuit without physical electrical connections.

9. The ion implantation system of claim 8, wherein the controller comprises an energy source, wherein energy from the energy source is transmitted to the energy harvest circuit wirelessly.

10. The ion implantation system of claim 1, wherein the transceiver comprises a fiber optic transceiver.

11. The ion implantation system of claim 1, wherein the monitoring circuit and the controller are disposed on one printed circuit board with separate ground and power planes.

12. A monitoring circuit for use with an ion implantation system, comprising:
    an energy harvest circuit to provide power;
    a pickup loop on which a voltage or current is induced;
    an amplifier to amplify a signal from the pickup loop;
    an analog to digital converter (ADC) to convert the signal to a digital representation; and
    a transceiver to transmit the digital representation to a controller;
    wherein the monitoring circuit is electrically isolated from the controller.

13. The monitoring circuit of claim 12, wherein the energy harvest circuit comprises a transducer, a conversion circuit and an energy storage circuit.

14. The monitoring circuit of claim 13, wherein the transducer comprises a photosensor.

15. The monitoring circuit of claim 12, wherein the transceiver comprises a fiber optic transceiver.

16. A monitoring circuit for use with an ion implantation system, comprising:
    an energy harvest circuit to provide power;
    a pickup loop on which a voltage or current is induced;
    an amplifier to amplify a signal from the pickup loop;
    an amplitude detection circuit;
    a phase detection circuit;
    an analog multiplexer having an output of the amplitude detection circuit and an output of the phase detection circuit as inputs; and
    a transceiver to transmit an output from the analog multiplexer to a controller; wherein the monitoring circuit is electrically isolated from the controller.

17. The monitoring circuit of claim 16, wherein the controller transmits a master clock signal to the monitoring circuit using the transceiver and the master clock signal is used by the phase detection circuit.

18. The monitoring circuit of claim 16, wherein the controller transmits a control signal to the monitoring circuit using the transceiver and the control signal is used by the analog multiplexer to select one of the inputs.

19. The monitoring circuit of claim 16, wherein the transceiver comprises a fiber optic transceiver.

20. The monitoring circuit of claim 15, wherein the energy harvest circuit comprises a transducer, a conversion circuit and an energy storage circuit.

* * * * *